United States Patent [19]

Bell et al.

[11] Patent Number: 5,463,191
[45] Date of Patent: Oct. 31, 1995

[54] CIRCUIT BOARD HAVING AN IMPROVED FINE PITCH BALL GRID ARRAY AND METHOD OF ASSEMBLY THEREFOR

[75] Inventors: James S. Bell, Cedar Park; Deepak Swamy, Austin, both of Tex.

[73] Assignee: Dell USA, L.P., Austin, Tex.

[21] Appl. No.: 212,477

[22] Filed: Mar. 14, 1994

[51] Int. Cl.⁶ ..................................................... H05U 1/00
[52] U.S. Cl. .......................... 174/263; 174/256; 174/257; 174/260; 361/767
[58] Field of Search ..................................... 174/256, 257, 174/260, 262, 263, 265, 266; 328/180.1; 361/767, 784, 792

[56] References Cited

U.S. PATENT DOCUMENTS 5,147,084  9/1992  Behun et al. .
5,180,440  1/1993  Siegel et al. .

Primary Examiner—Leo P. Picard
Assistant Examiner—Cheryl R. Figlin
Attorney, Agent, or Firm—David Hitt; James Huffman

[57] ABSTRACT

A circuit board design featuring a fine pitch ball grid array ("BGA") having a simplified construction. The circuit board comprises: (1) an insulating substrate, the substrate having a via therethrough, (2) a conductive layer located over the substrate, the via passing through the layer and laterally uninterrupted through the circuit board, (3) a first solder having a first melting point located within and substantially blocking the via and (4) a second solder having a second melting point located over the blocked via, the second melting point lower than the first melting point, the first solder remaining substantially solid and preventing the second solder from substantially entering the via when the first and second solders are heated to a temperature between the first and second melting points. The present invention eliminates precision drilling required by current blind via BGA pad designs.

25 Claims, 3 Drawing Sheets

CIRCUIT BOARD HAVING AN IMPROVED FINE PITCH BALL GRID ARRAY AND METHOD OF ASSEMBLY THEREFOR

TECHNICAL FIELD OF THE INVENTION

The present invention is directed, in general, to circuit boards and, more specifically, to circuit boards able to accommodate a fine pitch ball grid array ("BGA").

BACKGROUND OF THE INVENTION

For many years, it has been customary to employ printed circuit boards ("PCBs") or printed circuit assemblies ("PCAs") as a medium for mechanically holding electronic components together and for providing electrical interconnections among the components. The earliest PCBs were constructed of an insulating planar substrate (such as a glass fiber/resin combination) upon which was deposited a layer of conductive metal. Most typically, the metal layer coated the entire surface of the substrate and was chemically etched to place a pattern of conductors (or "traces") on the surface. Often, metal layers were provided on both the upper and lower surfaces of the substrate to allow conductors to cross one another without making electrical contact. A plurality of mounting holes or "vias" were drilled through the metal layer and substrate. The vias were situated to receive leads from the electronic components (so-called "through-hole" mounting).

To complete assembly of a circuit board, the electronic components were placed on the PCB, either by hand or robotic machine, the leads of the components passing through corresponding vias. Lastly, solder connections were made to ensure reliable electrical contact between the components and the traces. Initially, soldering was performed manually. Subsequently, more efficient machine-soldering techniques employing infrared ovens or solder baths were developed to speed manufacture of circuit boards and to ensure higher solder joint reliability.

Under such machine-soldering techniques, the PCB and its components were heated. Solder, under the influence of flux, was caused to contact the board and flowed by capillary action into the vias, yielding a low resistance solder joint when cooled.

As circuit board technology developed, designers began to create circuit boards comprising many alternating substrate and conductive layer pairs, resulting in sandwiched circuit boards that could accommodate a higher component density. Such boards could accommodate ten or more conductive layers.

Later, surface-mount technology allowed the leads to be soldered to solder pads on the surface of the circuit board, rather than requiring the leads to pass through vias to be soldered therein.

The electronic components themselves underwent changes to accommodate higher density. First, discrete components were combined into integrated circuits ("ICs"). ICs were originally placed in dual in-line packages ("DIPs") consisting of an elongated plastic body encapsulating the IC and a plurality of electrical leads coupled to the IC and arranged in a series extending from the two long edges of the body. The leads could either be through-hole soldered or surface-mounted. Unfortunately, the number of leads that a DIP could accommodate was a function of twice the length of the DIP body edges. Some improvement was made by providing packages having leads extending from all four edges of the body, but, even so, the number of leads was a function of the perimetral length of the body edges.

Next, in an effort to increase lead density further (to address, in particular, the increasing power and density of microprocessors and the stringent space requirements of notebook, subnotebook and personal digital assistant ("PDA") computers), designers developed quad flat packs ("QFPs") comprising a generally square body having leads extending downward from the lower surface of the body. The leads were typically arranged in multiple rows and columns, allowing the QFPs to accommodate more pins than DIPs. However, limitations in socket size and collective lead insertion force began to be problematical.

Currently, designers are focussing on ball grid array ("BGA") packaging wherein leads are dispensed with and replaced with a finely-pitched matrix of conductive contact surfaces on the lower surface of an otherwise conventional body. The circuit board to which a BGA package is to be mounted is provided with a matrix of corresponding surfaces ("pads") upon each of which is deposited a small quantity of solder. To mount the BGA package to the circuit board, the BGA package is temporarily clamped to the board and the board heated (typically by application of infrared energy), causing the solder to melt, fusing the corresponding surfaces together and yielding a strong mechanical and electrical connection when cooled.

BGA packaging is proving to be a powerful ally in the further miniaturization of computers. However, the circuit boards designed to receive the BGAs are lagging in compactness. The problem centers on how to route the electrical conductors from each BGA pad through the circuit board.

In multi-layer boards, electrical signals are routed from layer to layer by metal-coated vias. Accordingly, a via is required for each pad to communicate electrical signals between the pad to a trace on another layer of the board. As will be illustrated, most current circuit board designs employ a matrix of vias that is spatially offset from the matrix of pads and coupled thereto by short traces. Unfortunately, this results in a board layout that is in excess of the footprint of the BGA package, hindering compactness.

Further, it is not possible simply to place a via under each solder pad since, when the BGA package is clamped to the board and the board heated, the solder pads drain into the empty via below, rather than spreading out between the pad and the BGA surface. This results in unacceptably poor and unreliable solder joints.

To overcome this disadvantage, designers developed a "blind via" approach wherein precision via-drilling equipment is employed to drill the vias from underneath the board almost, but not entirely, through the full lateral thickness of the board. Instead, the via is stopped when it reaches a topmost conductive layer that has been divided into pads. Solder is placed on the topmost pad layer. When the BGA package is clamped on and the solder heated, the topmost pad layer prevents the solder from draining into the via.

However, there are two significant disadvantages with this process. First, the precision (in all three axes) that is required of the drilling operation and of the board thickness inevitably raises manufacturing cost and rejection rates. Second, since such vias are plated with a conductive coating on an inner surface thereof, the fact that the via does not pass entirely through the board presents a challenge to conventional via plating techniques, often resulting in inadequately plated vias and high resistance or nonexistent interlayer connections.

Accordingly, what is needed in the art is a less expensive and more reliable method of providing a fine pitch BGA pad matrix on a circuit board.

SUMMARY OF THE INVENTION

To address the above-discussed deficiencies of the prior art, it is a primary object of the present invention to provide a fine pitch BGA pad matrix that locates vias directly beneath their corresponding pads without requiring controlled-depth via drilling or unconventional via plating technologies.

Accordingly, in the attainment of the above-described primary object, the present invention provides a circuit board design featuring a fine pitch ball grid array ("BGA") having a simplified construction. The circuit board comprises: (1) an insulating substrate, the substrate having a via therethrough, (2) a conductive layer located over the substrate, the via passing through the layer and laterally uninterrupted through the circuit board, (3) a first solder having a first melting point located within and substantially blocking the via and (4) a second solder having a second melting point located over the blocked via, the second melting point lower than the first melting point. The first solder remains substantially solid and prevents the second solder from substantially entering the via when the first and second solders are heated to a temperature between the first and second melting points. The second solder preferably constitutes a pad for receiving an electrical contact. The pad is preferably a portion of a BGA. In a preferred embodiment, the circuit board is adapted to hold components of a computer system and, more particularly, a personal computer ("PC").

Thus, once the first solder is in place, the via is blocked and the second solder is constrained to spread between the pad on the circuit board and the corresponding surface contact on the BGA package. The present invention eliminates precision drilling required in current blind via BGA pad designs by taking advantage of differing melting points of different types of solder.

In a preferred embodiment, the circuit board further comprises a conductive coating located between the first solder and an inner surface of the via. This coating is preferably applied after the via is drilled completely through the circuit board and is preferably applied using conventional via-plating techniques. Thus, new and more expensive technologies required to plate vias that terminate within a circuit board are rendered unnecessary.

In a preferred embodiment, the circuit board further comprises a second conductive layer located under the substrate, the conductive coating within the via electrically coupling the conductive layer over the substrate to the second conductive layer. Electrical signals can thus be communicated between the BGA pad on the conductive layer over the substrate and the second conductive layer by means of the plated via for distribution elsewhere on the circuit board.

In one embodiment of the present invention, the circuit board is a PCB. In another embodiment, the circuit board is a PCA. In its PCA embodiment, the circuit board further comprises a solder mask located over the conductive layer. The solder mask constrains a location of the second solder over the via, thereby arranging the second solder into a matrix of pads corresponding to a BGA package.

In a preferred embodiment, the circuit board further comprises a plurality of alternating substrate and conductive layers forming a plurality of spaced-apart conductive patterns for communication of electrical signals. Therefore the circuit board is a multi-layer board. In such boards, the substrate and the conductive layer are substantially planar and are laminated to one another to form a substantially planar circuit board. It is preferred that the conductive layer be an outer layer of the circuit board. This allows a BGA package to be secured in a conventional manner to an outer surface of the board, as opposed to begin laminated within or recessed into the board. The present invention does not require the conductive layer to be the outer layer, however.

In a preferred embodiment, the first solder and second solder are tin-lead compositions of varying ratios. In a more preferred embodiment, the first solder is composed of about 10% tin and about 90% lead and the second solder is composed of about 63% tin and about 37% lead. Thus, the two solders have different melting point, of which advantage is taken during manufacture of the circuit board. As is conventional, the conductive layer is copper metal.

Once the first solder is deposited within the via, it is preferably reflowed to ensure a blocking of the via. In reflow, the first solder liquifies and creates a meniscus within the via, typically a convex meniscus. The second solder contacts, but does not move, the meniscus as the second solder is heated.

The foregoing has outlined rather broadly the features and technical advantages of the present invention so that the detailed description of the invention that follows may be better understood. Additional features and advantages of the invention will be described hereinafter which form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
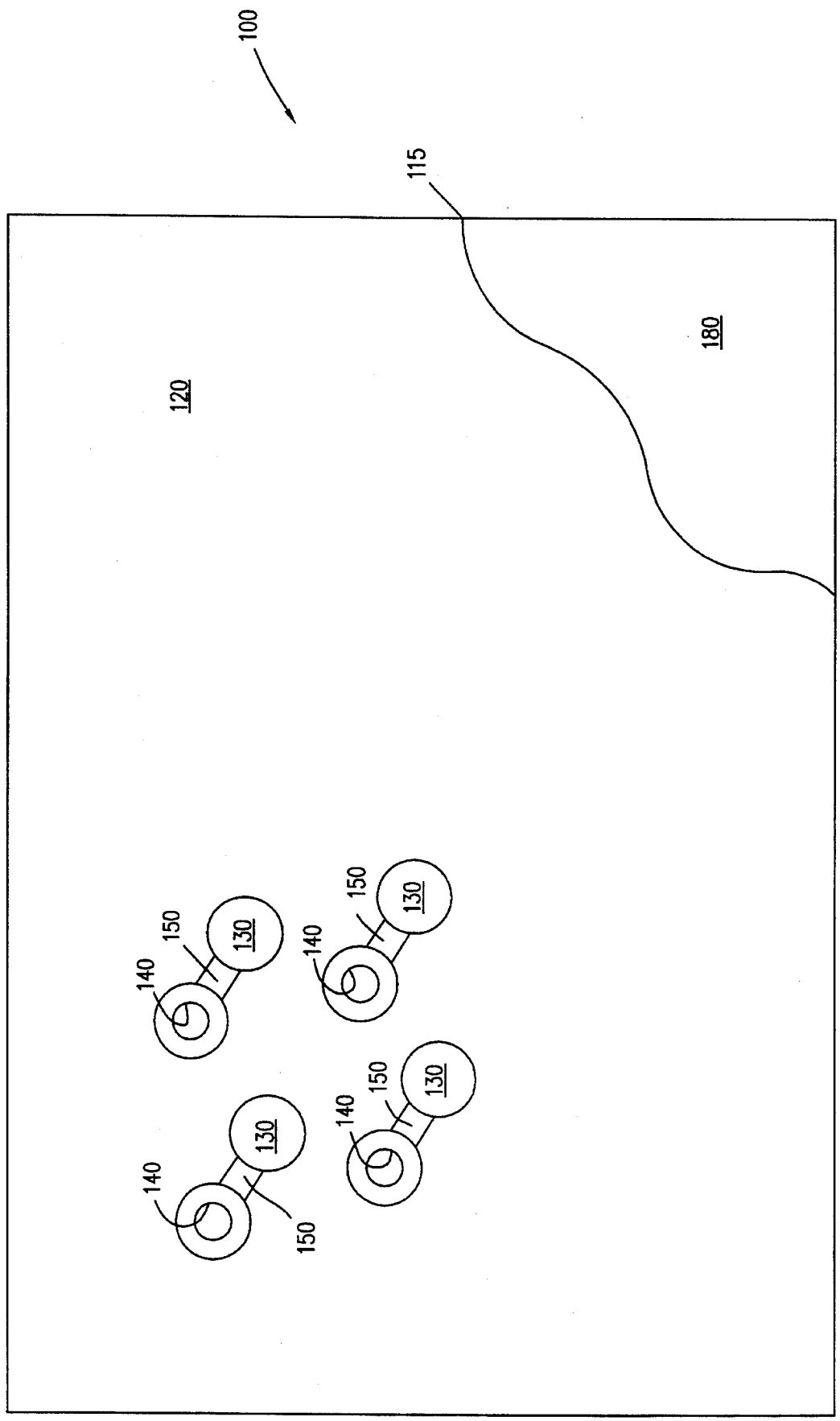
FIG. 1 illustrates a plan view of a circuit board including a prior art BGA matrix having offset vias.

Referring initially to FIG. 1, illustrated is a plan view of a circuit board, generally designated 100, including a prior art BGA matrix having offset vias. Shown are a substrate 110 having a conductive layer 120 located thereon. The substrate 110 is conventional in composition, for instance, a glass fiber and polymer resin combination typically referred to as fiberglass. The substrate 110 is substantially planar, having an upper surface 115 and a lower surface (not shown). For simplicity, FIG. 1 shows the conductive layer 120 deposited on only the upper surface 115 of the substrate 110, although those skilled in the art realize that many prior art circuit boards have conductive layers deposited on both the upper and lower surfaces to accommodate more traces.

The conductive layer 120 is shown as a planar coating (often composed of copper metal) deposited on the upper surface 115 of the substrate 110 as a plurality of small pads arranged in an orthogonal matrix, save for a small area that has been cut away to show the underlying substrate 110. Those skilled in the art are aware of coating deposition or removal techniques (such as plating or etching) that allow selective deposition or removal of portions of the conductive layer 120 to produce a matrix of pads 130 in the conductive layer 120. This matrix of pads 130 (only a small number of which are shown in FIG. 1) serves to form an attach point for a BGA package as previously described. Thus, each of the pads is designed to receive a small quantity of solder thereon, deposited as a layer of more or less uniform thickness or as a sphere.

FIG. 1 further shows a plurality of vias 140 offset from the pads 130 that pass through both the substrate 110 and the conductive layer 120. The vias 140 are plated on an inner surface thereof with a conductive coating. The conductive coating allows the plurality of vias to carry electrical signals among the various layers of the circuit board 100, depending upon the location of traces on each of the layers. On a typical circuit board 100, many such vias are arranged according to a desired component placement. The vias 140 are coupled to respective pads 130 by a plurality of short traces 150.

Offsetting the vias 140 from the pads 130 allows standard through-hole vias to be used, thereby permitting standard via drilling and plating techniques (such as conventional electroless copper plating). Unfortunately, each pad/via/trace combination presents a larger footprint, enlarging the overall footprint of the BGA matrix and limiting the pitch of the matrix (the distance between individual pads). Through-hole vias could not be placed directly under the pads 130 because the solder deposited on the pads 130 drained into the vias during subsequent reflow, defeating the purpose of the pads 130.

Figure 2:
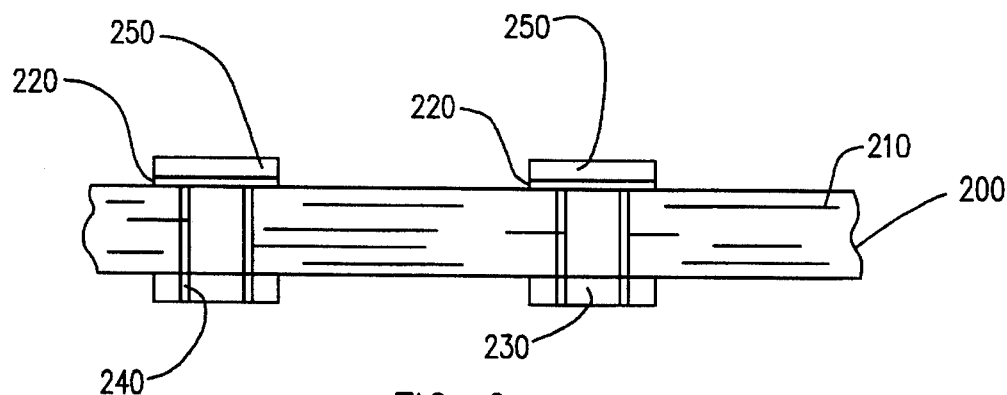
FIG. 2 illustrates an elevational view of a circuit board including a prior art BGA matrix employing blind vias.

Turning now to FIG. 2, illustrated is an elevational view of a circuit board, generally designated 200, including a prior art BGA matrix employing blind vias. As previously described, blind vias were developed as a way to place vias directly under each pad. Accordingly, FIG. 2 shows a plurality of conductive layers 210 within the circuit board 200. A topmost conductive layer 220 forms an outer layer of the circuit board 200. Following conventional lamination of the circuit board 200 and deposition of the topmost conductive layer 210, blind vias 230 are drilled from the opposite (or lower) side of the circuit board 200 upward, as shown, until the ends of the vias 230 exactly meet the underside of the topmost conductive layer 220. As previously described, this controlled-depth via-drilling process requires very accurate and expensive drills.

Once the blind vias 230 have been drilled, they must be coated on an inner surface thereof by a conductive coating. Accordingly, FIG. 2 shows a conductive coating 240 deposited on an inner surface of the vias 230. However, as has been described, since the vias 230 are blind or dead-ended into the topmost conductive layer 220, conventional plating techniques, such as electroless deposition, are not available. Such techniques rely on the free passage of air and coating composition completely though the vias 230. Since the blind vias 230 do not allow such free low, new technology must be developed to plate such vias 230.

Finally, solder 250 is deposited over the topmost layer 220. The topmost layer prevents the solder 250 from flowing into the blind via 230 when the solder 250 is reflowed.

Figure 3:
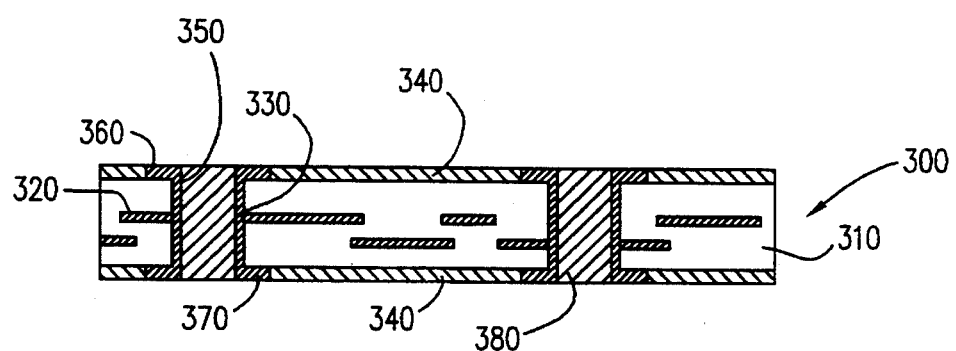
FIGS. 3–5 illustrate elevational views of a PCB manufactured according to the method of the present invention.
Figure 4:
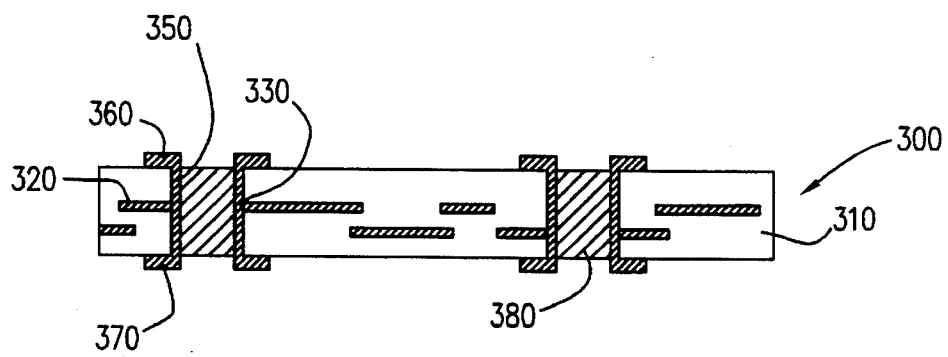
Figure 5:
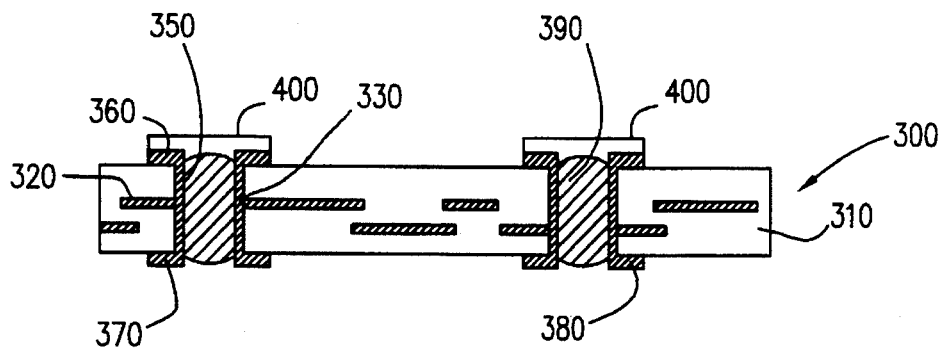

Turning now to FIGS. 3–5, illustrated are elevational views of a PCB manufactured according to the method of the present invention.

FIG. 3 shows a PCB-configured circuit board, generally designated 300, comprising a plurality of substrate layers 310 and conductive layers 320 that have been laminated together in a conventional manner. A plurality of vias 330 are drilled entirely through the circuit board. Next, a photoresist layer 340 is deposited on an upper surface of the circuit board 300. The photoresist layer 340 has a pattern defined therein corresponding to the desired location of the pads of the BGA matrix to be formed.

Next, a conductive composition is plated via a conventional plating technique (such as electroless plating) on an inner surface of each of the vias 330, forming a conducive coating 350 and completing electrical connections between selected ones of the various conductive layers 320. This conductive composition also forms a topmost conductive layer 360 over the upper surface of the circuit board 300 and a second, bottommost conductive layer 370 under a lower surface of the circuit board 300. The topmost conductive layer 360 forms a portion of the surface upon which a relatively low melting point solder is to be subsequently deposited.

Next, a first solder 380 having a first melting point is deposited into the vias 130. The first solder 380 is, in one embodiment, composed of about 10% tin and about 90% lead. In a preferred embodiment, the first solder 380 is squeegied in a conventional manner into the vias 330.

Turning now to FIG. 4, a chemical etch is used to strip the photoresist layer 340 away. The etching process erodes a small amount of the first solder 380 at its ends thereof.

Turning now to FIG. 5, the circuit board 300 is heated to a temperature at least equalling the first melting point, causing the first solder 380 to reflow. During this process, the first solder 380 liquifies, causing the first solder 380 to bond chemically with the conductive coating 350. During this reflow process, the first solder 380 forms a meniscus 390 within the vias 330. The meniscus 390 provides a surface that prevents a subsequently deposited solder from passing through the vias 330.

Finally, a second solder 400 having a second melting point is deposited over the topmost conductive layer 360 and the meniscus 390. In one embodiment, the second solder is composed of about 63% tin and about 37% lead. At this point, a BGA package can be mated to the circuit board 300 and the second solder 400 can be reflowed to complete a solder joint with corresponding surfaces on an underside of the BGA package. During this subsequent reflow, the circuit board 300 is heated to a temperature greater than the second melting point (thereby liquefying the second solder 400) but less than the first melting point (thereby maintaining the blockage created by the first solder 380 within the vias 330.

Figure 6:
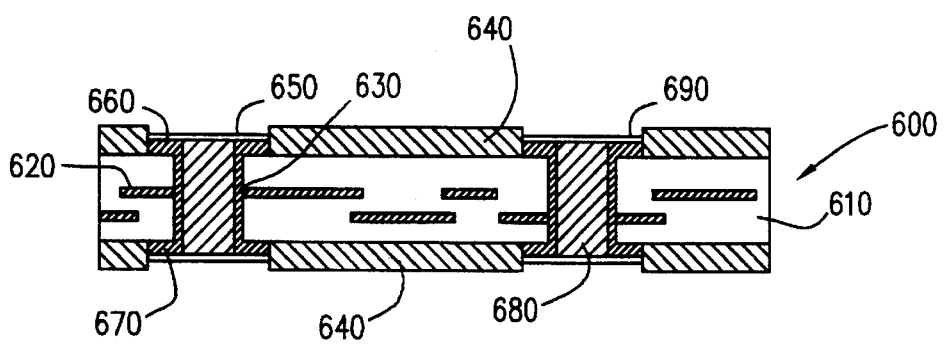
FIGS. 6–7 illustrate elevational views of a PCA manufactured according to the method of the present invention.
Figure 7:
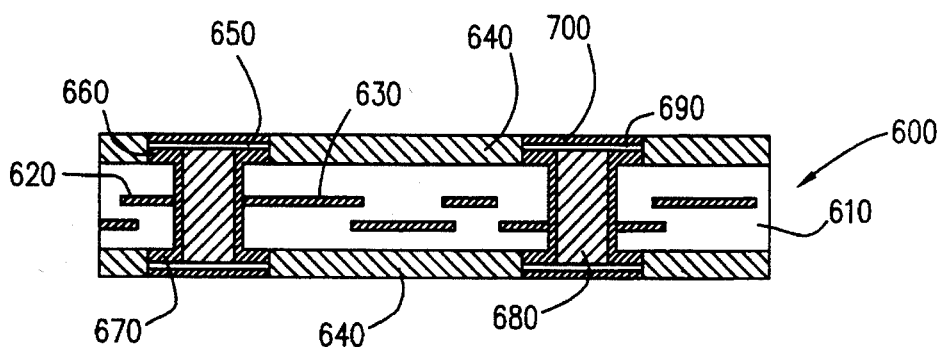

Turning now to FIGS. 6–7, illustrated are elevational views of a PCA manufactured according to the method of the present invention.

FIG. 6 shows a PCA-configured circuit board, generally designated 600, comprising a plurality of substrate layers 610 and conductive layers 620 that have been laminated together in a conventional manner. A plurality of vias 630 are drilled entirely through the circuit board. Next, a solder mask 640 is deposited on an upper surface of the circuit board 600. The solder mask layer 640 has a pattern defined therein corresponding to the desired location of the pads of the BGA matrix to be formed.

Next, a conductive composition is plated via a conventional plating technique (such as electroless plating) on an inner surface of each of the vias 630, forming a conducive coating 650 and completing electrical connections between selected ones of the various conductive layers 620. This conductive composition also forms a topmost conductive layer 660 over the upper surface of the circuit board 600 and a second, bottommost conductive layer 670 under a lower surface of the circuit board 600. The topmost conductive layer 660 forms a portion of the surface upon which a relatively low melting point solder is to be subsequently deposited.

Next, a first solder 680 having a first melting point is deposited into the vias 130. The first solder 680 is, in one embodiment, composed of about 10% tin and about 90% lead. In a preferred embodiment, the first solder 680 is squeegied in a conventional manner into the vias 630. During manufacture of a PCA, the solder mask 640 is not removed, as was the case in the manufacture of a PCB. Since the solder mask 640 is not removed by etching, the first solder 680 is not also etched back, as was the case before.

The circuit board 600 is heated to a temperature at least equalling the first melting point, causing the first solder 680 to reflow. During this process, the first solder 680 liquifies, causing the first solder 680 to bond chemically with the conductive coating 650. During this reflow process, since the first solder 680 completely fills the vias 630, a meniscus is not formed. Rather, a level surface 690 provides a surface that prevents a subsequently deposited solder from passing through the vias 630.

Turning now to FIG. 7, a second solder 700 having a second melting point is deposited over the topmost conductive layer 660 and the level surface 690. In one embodiment, the second solder is composed of about 63% tin and about 37% lead. At this point, a BGA package can be mated to the circuit board 600 and the second solder 700 can be reflowed to complete a solder joint with corresponding surfaces on an underside of the BGA package. During this subsequent reflow, the circuit board 600 is again heated to a temperature greater than the second melting point (thereby liquefying the second solder 700) but less than the first melting point (thereby maintaining the blockage created by the first solder 680 within the vias 630.

From the above description, it is apparent that the present invention provides a circuit board comprising: (1) an insulating substrate, the substrate having a via therethrough, (2) a conductive layer located over the substrate, the via passing through the layer and laterally uninterrupted through the circuit board, (3) a first solder having a first melting point located within and substantially blocking the via and (4) a second solder having a second melting point located over the blocked via, the second melting point lower than the first melting point, the first solder remaining substantially solid and preventing the second solder from substantially entering the via when the first and second solders are heated to a temperature between the first and second melting points.

Although the present invention and its advantages have been described in detail, it should be understood that various changes, substitutions and alterations can be made herein without departing from the spirit and scope of the invention as defined by the appended claims.

What is claimed is:

1. A circuit board, comprising:

an insulating substrate, said substrate having a via therethrough;

a conductive layer located over said substrate, said via passing through said layer and laterally uninterrupted through said circuit board;

a first solder having a first melting point located within and substantially blocking said via; and a second solder having a second melting point located over said blocked via, said second melting point lower than said first melting point, said first solder remaining substantially solid and preventing said second solder from substantially entering said via when said first and second solders are heated to a temperature between said first and second melting points.

2. The circuit board as recited in claim 1 further comprising a conductive coating located between said first solder and an inner surface of said via.

3. The circuit board as recited in claim 1 further comprising a solder mask located over said conductive layer, said solder mask constraining a location of said second solder over said via.

4. The circuit board as recited in claim 1 wherein said conductive layer is an outer layer of said circuit board.

5. The circuit board as recited in claim 1 wherein said substrate and said conductive layer are substantially planar.

6. The circuit board as recited in claim 1 wherein said first solder is a tin-lead composition.

7. The circuit board as recited in claim 1 wherein said second solder is a tin-lead composition.

8. The circuit board as recited in claim 1 wherein said conductive layer is copper metal.

9. The circuit board as recited in claim 1 wherein said first solder has a meniscus within said via, said second solder contacting said meniscus.

10. The circuit board as recited in claim 1 wherein said second solder constitutes a pad for receiving an electrical contact.

11. A circuit board, comprising:

a substantially planar insulating substrate, said substrate having a via therethrough;

a substantially planar conductive layer located over said substrate and forming an outer layer of said circuit board, said via passing through said layer and laterally uninterrupted through said circuit board, said via having a conductive coating located on an inner surface thereof;

a first solder having a first melting point located within and substantially blocking said via; and a second solder having a second melting point located over said blocked via, said second melting point lower than said first melting point, said first solder remaining substantially solid and preventing said second solder from substantially entering said via when said first and second solders are heated to a temperature between said first and second melting points, said second solder constituting a pad for receiving an electrical contact.

12. The circuit board as recited in claim 1, further comprising a solder mask located over said conductive layer, said solder mask constraining a location of said second solder over said via.

13. The circuit board as recited in claim 11, wherein said first solder is a tin-lead composition.

14. The circuit board as recited in claim 11 wherein said second solder is a tin-lead composition.

15. The circuit board as recited in claim 11 wherein said conductive layer is copper metal.

16. The circuit board as recited in claim 11 wherein said first solder has a meniscus within said via, said second solder contacting said meniscus.

17. The circuit board as recited in claim 11 further comprising a plurality of alternating substrate and conductive layers forming a plurality of spaced-apart conductive patterns for communication of electrical signals.

18. The circuit board as recited in claim 11 wherein said pad is a portion of a ball grid array (BGA).

19. The circuit board as recited in claim 11 further comprising a second conductive layer located under said substrate, said conductive coating electrically coupling said conductive layer over said substrate to said second conductive layer.

20. The circuit board as recited in claim 11 wherein said circuit board is adapted to hold components of a computer system.

21. A multi-layer circuit board adapted to hold components of a computer system, comprising:

a substantially planar insulating substrate, said substrate having a via therethrough;

a first substantially planar copper metal conductive layer located over said substrate and forming an outer layer of said circuit board;

a second substantially planar copper metal conductive layer located under said substrate, said via passing through said first and second layers and laterally uninterrupted through said circuit board, said via having a conductive coating located on an inner surface thereof, said conductive coating electrically coupling said first conductive layer to said second conductive layer;

a first tin-lead solder having a first melting point located within and substantially blocking said via; and a second tin-lead solder having a second melting point located over said blocked via, said second melting point lower than said first melting point, said second tin-lead solder remaining substantially solid and preventing said first tin-lead solder from substantially entering said via when said first tin-lead and said second tin-lead solders are heated to a temperature between said first and second melting points, said second tin-lead solder constituting a pad for receiving an electrical contact.

22. The circuit board as recited in claim 21 further comprising a solder mask located over said conductive layer, said solder mask constraining a location of said tin-lead solder over said via.

23. The circuit board as recited in claim 21 wherein said tin-bismuth solder has a meniscus within said via, said tin-lead solder contacting said meniscus.

24. The circuit board as recited in claim 21 further comprising a plurality of alternating substrate and conductive layers forming a plurality of spaced-apart conductive patterns for communication of electrical signals.

25. The circuit board as recited in claim 21 wherein said pad is a portion of a ball grid array (BGA).

\* \* \* \* \*